United States Patent
Harmon et al.

(10) Patent No.: US 6,809,400 B2
(45) Date of Patent: Oct. 26, 2004

(54) COMPOSITE PININ COLLECTOR STRUCTURE FOR HETEROJUNCTION BIPOLAR TRANSISTORS

(76) Inventors: Eric Harmon, 314 Main St., Norfolk, MA (US) 02056; Jerry Woodall, 500 Prospect St., New Haven, CT (US) 06511-2166; Hironori Tsukamoto, Apt. #5, 665 Whitney Ave., New Haven, CT (US) 06511; David Salzman, 4407 Elm St., Chevy Chase, MD (US) 20815

( * ) Notice: Subject to any disclaimer, the term of this patent is extended or adjusted under 35 U.S.C. 154(b) by 0 days.

(21) Appl. No.: 10/389,230

(22) Filed: Mar. 14, 2003

(65) Prior Publication Data

US 2004/0178475 A1 Sep. 16, 2004

(51) Int. Cl.$^7$ .......................................... H01L 27/082
(52) U.S. Cl. .................. 257/567; 257/47; 257/197; 257/273; 257/370; 257/477; 257/511; 257/565
(58) Field of Search .................. 257/47, 197, 205, 257/273, 350, 361, 370, 378, 423, 462, 477–479, 511, 512, 517, 518, 525, 526, 539–543, 552–593

(56) References Cited

U.S. PATENT DOCUMENTS

| 4,847,666 A | * | 7/1989 | Heremans et al. ............ 257/26 |
| 5,625,206 A | * | 4/1997 | Chandrasekhar et al. ... 257/198 |
| 5,631,477 A | * | 5/1997 | Streit et al. ................. 257/197 |

FOREIGN PATENT DOCUMENTS

JP        05021440 A   *   1/1993   ......... H01L/21/331

* cited by examiner

*Primary Examiner*—David Nelms
*Assistant Examiner*—Andy Huynh

(57) ABSTRACT

This disclosure describes a structure for transistor devices formed from compound semiconductor materials; and particularly for heterojuntion bipolar transistors (HBTs); and more particularly for the collector structure of a double HBT (DHBT). The invention enables high output power at high frequency operation, of high frequency operation at high output power.

18 Claims, 10 Drawing Sheets

Preferred embodiment

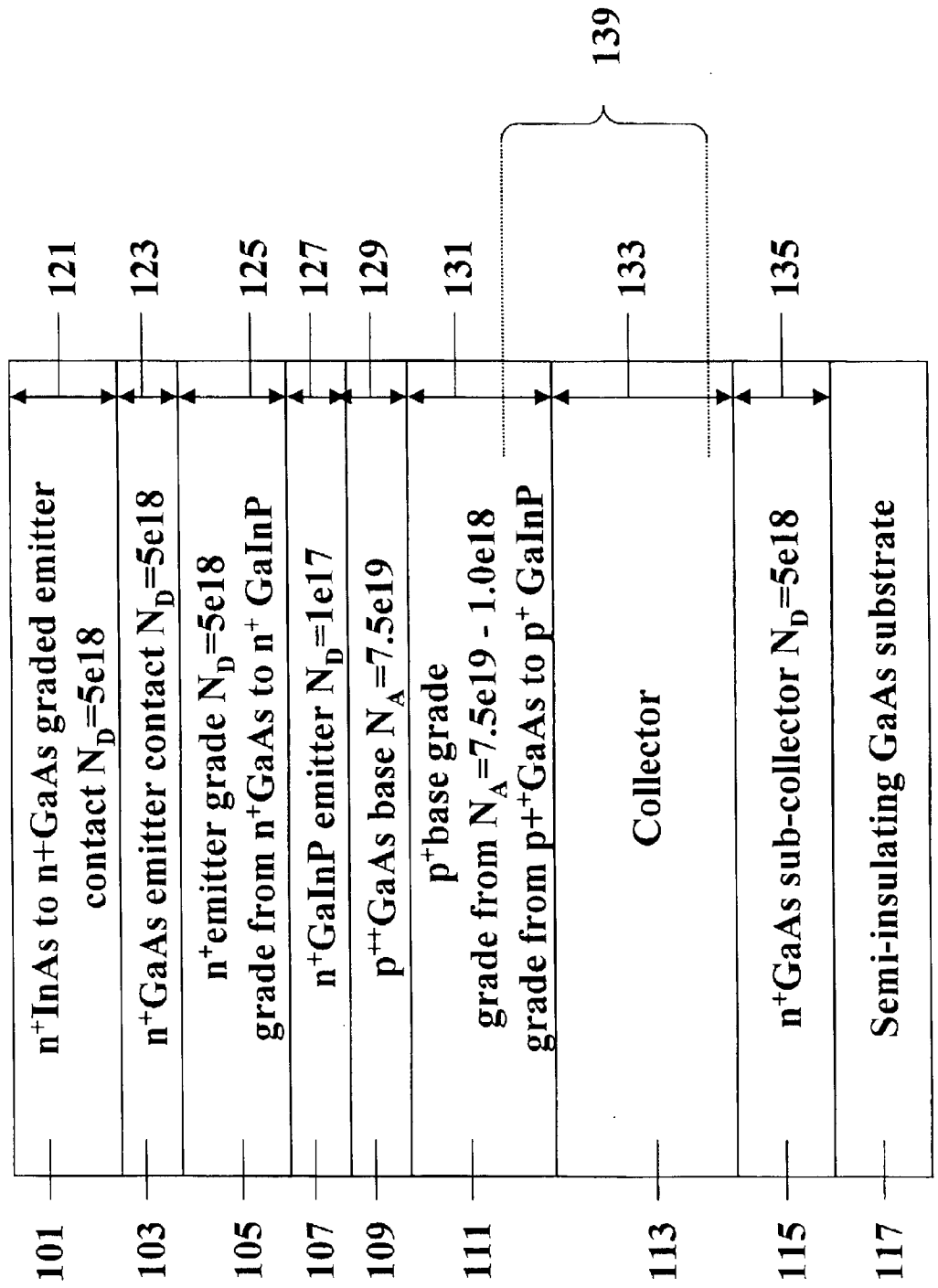
Figure 1: HBT structure

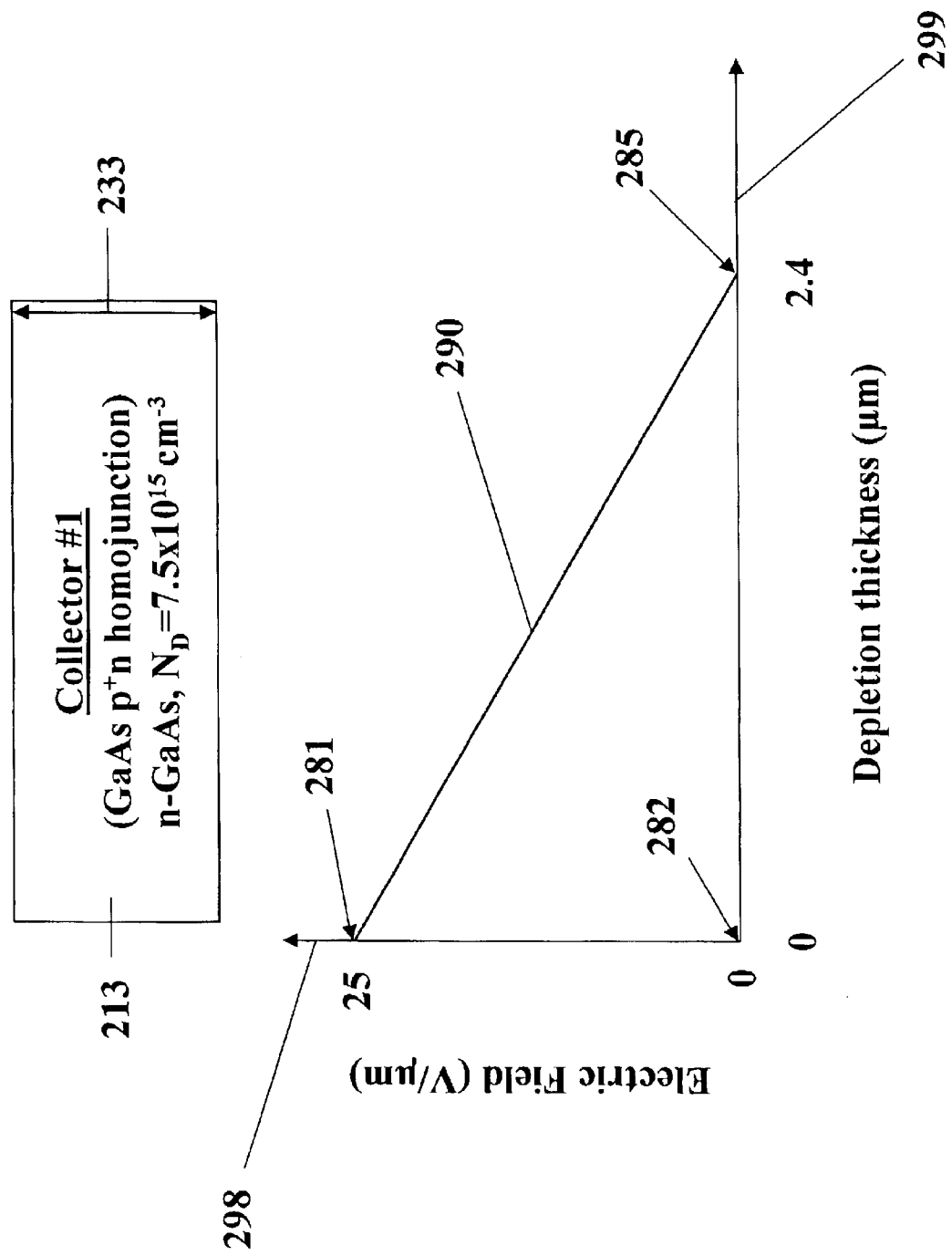
Figure 2: Prior art collector

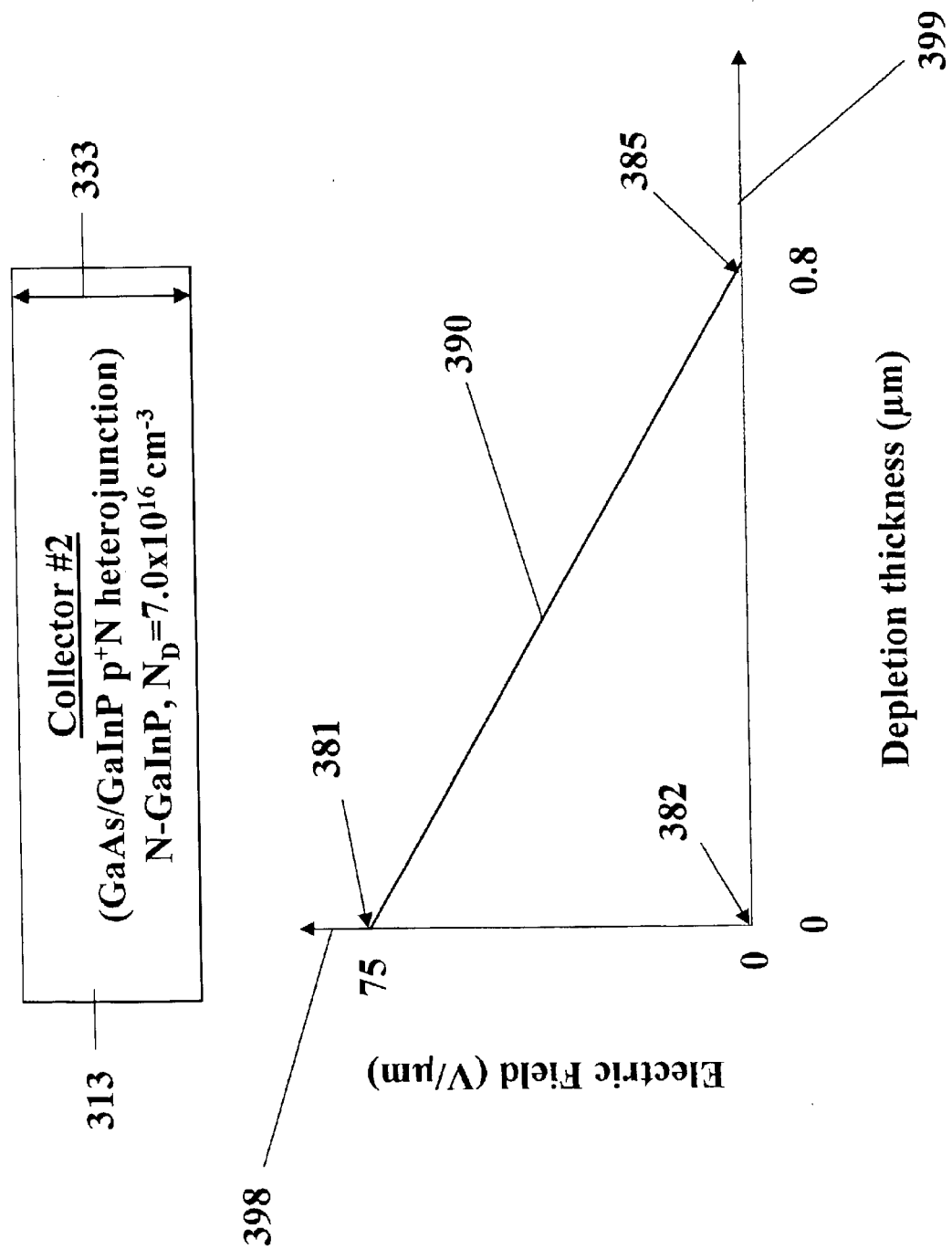
Figure 3: Prior art collector

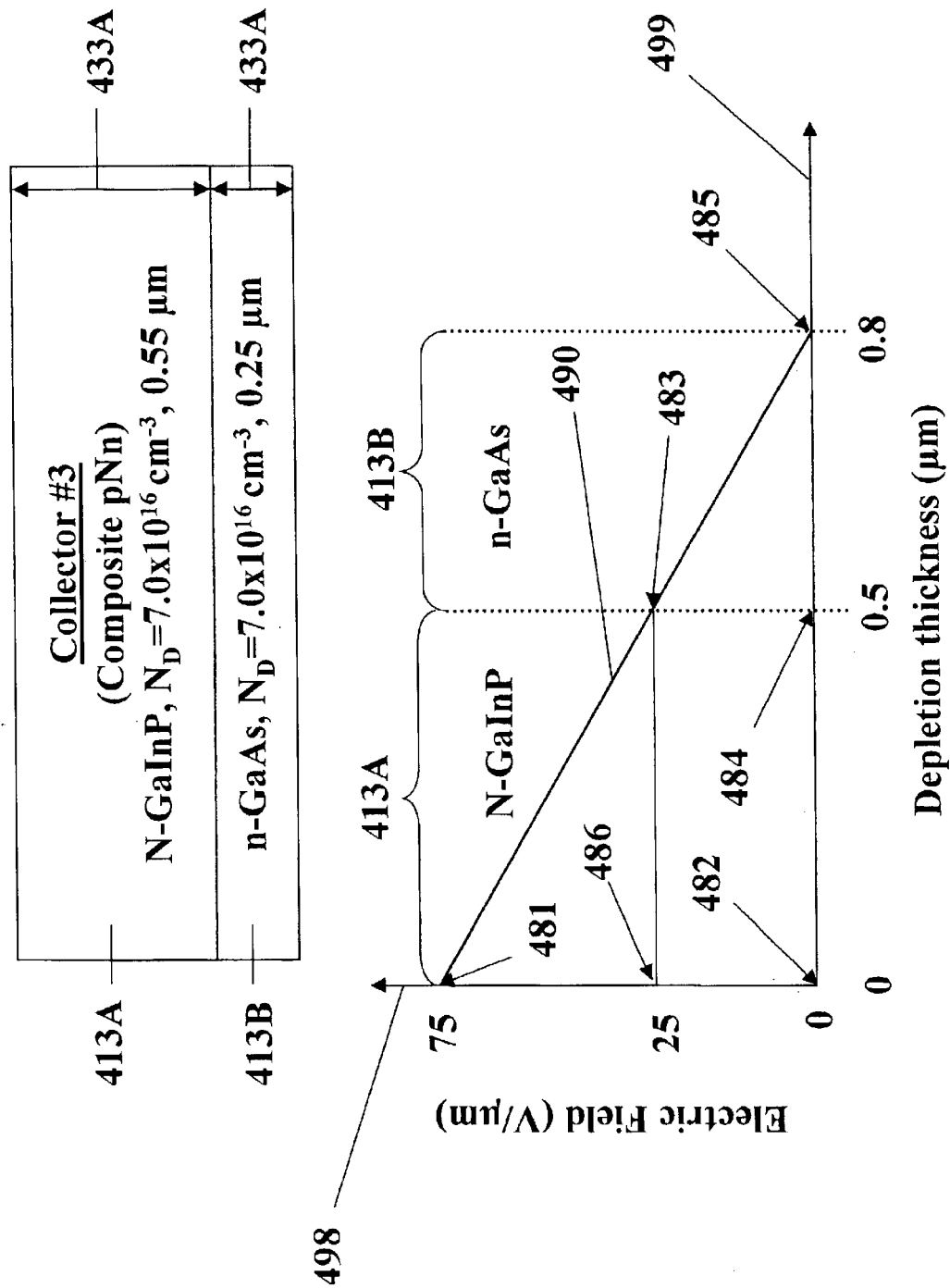
Figure 4: Prior art collector

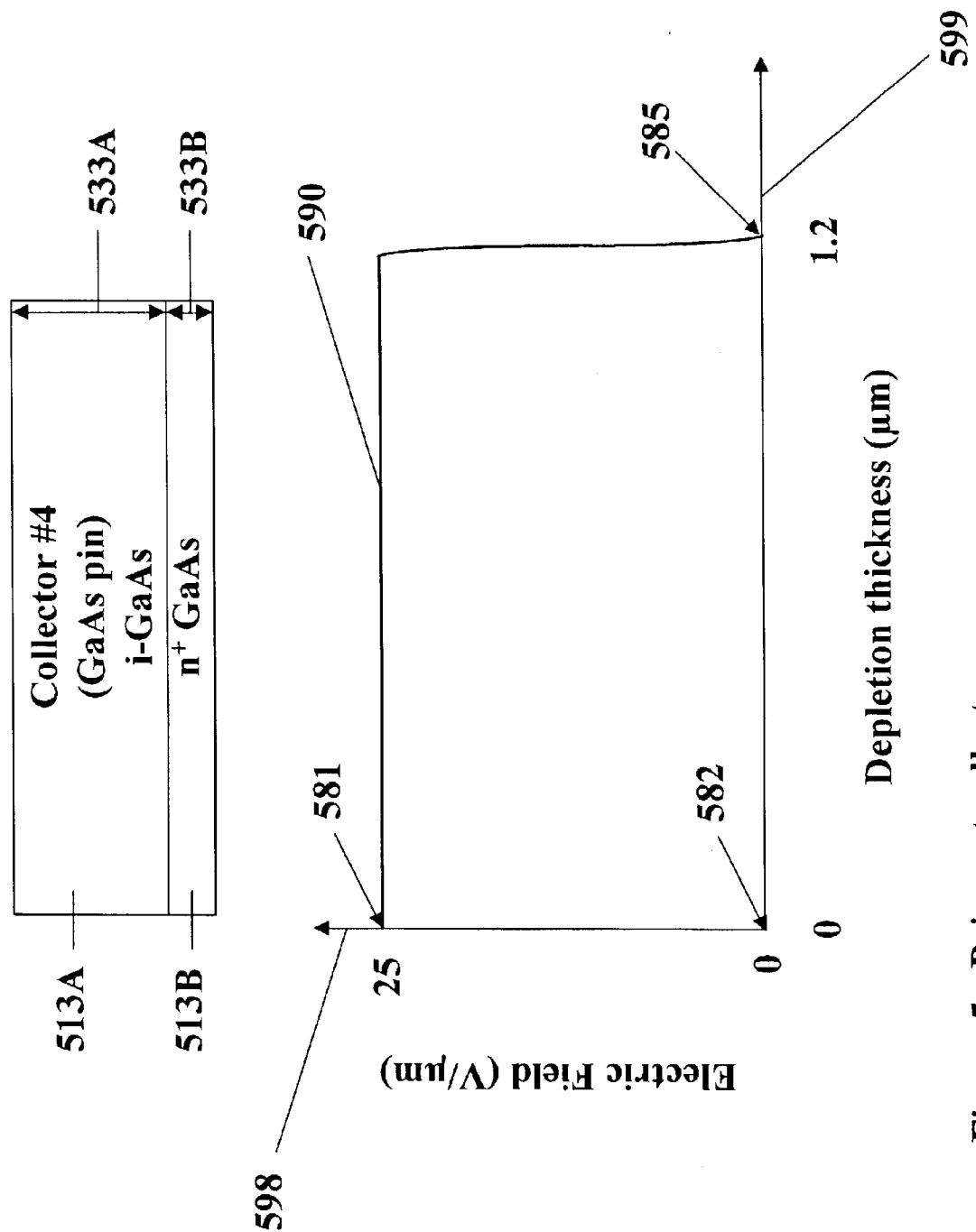
Figure 5: Prior art collector

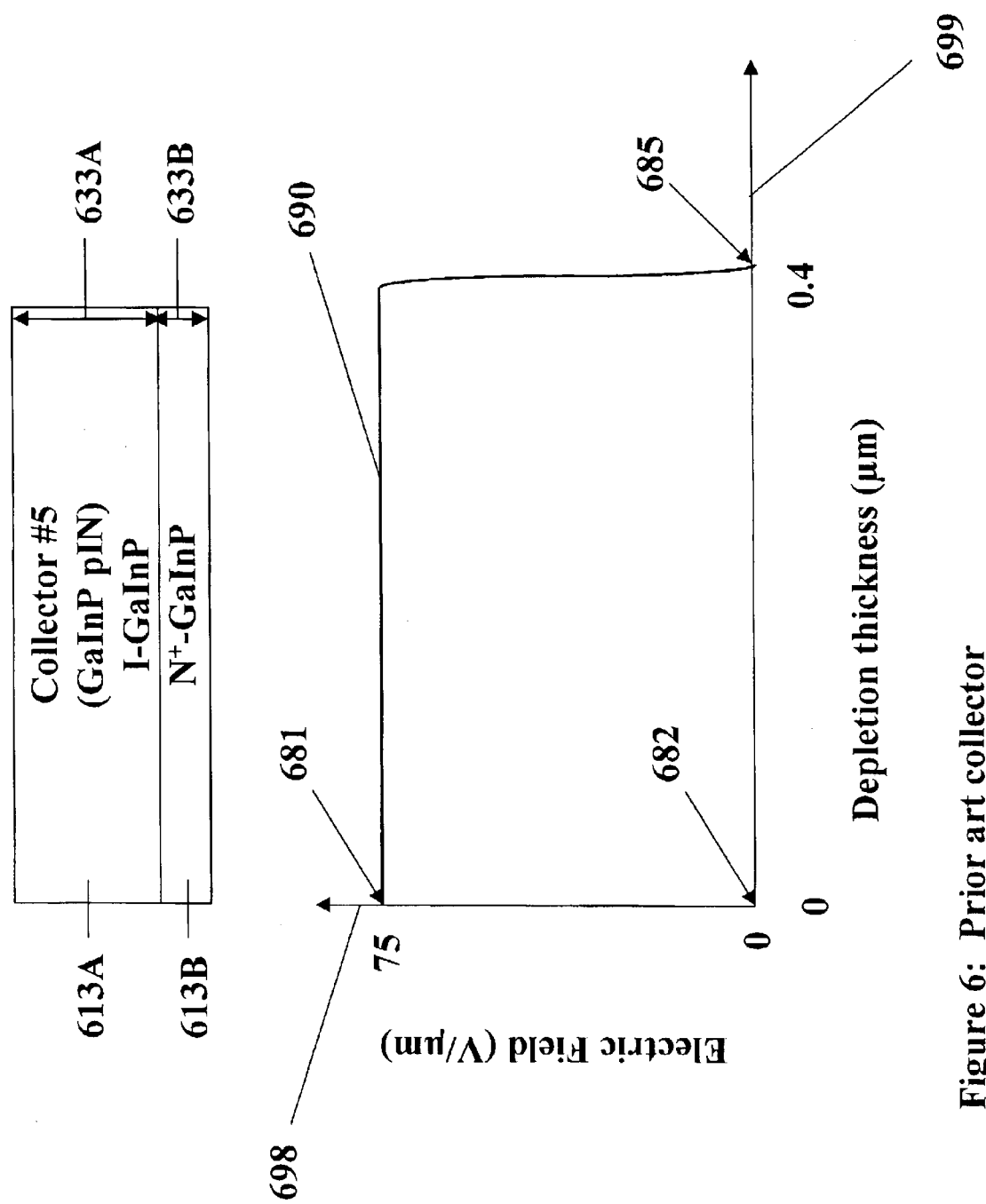
Figure 6: Prior art collector

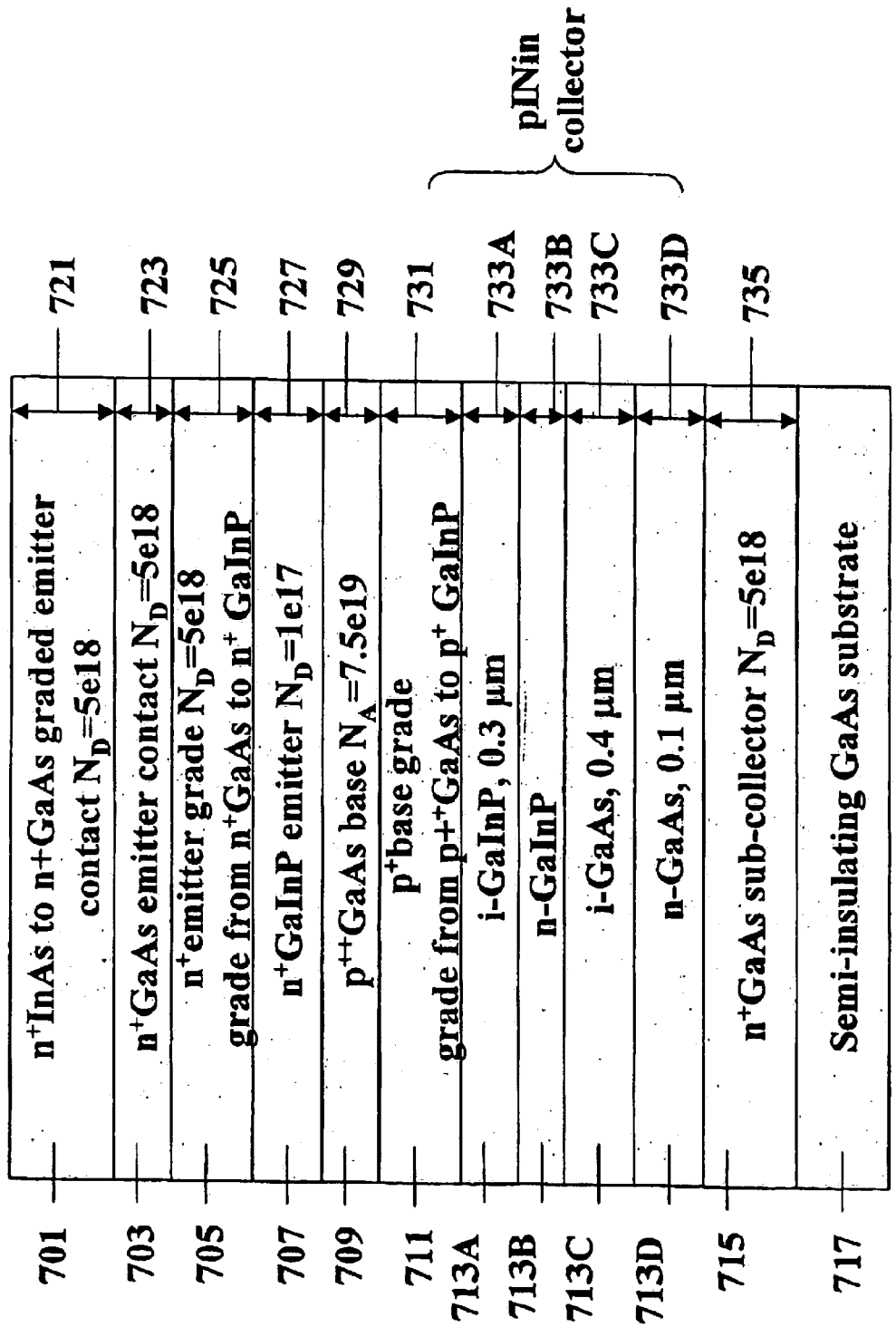
Figure 7: Preferred embodiment

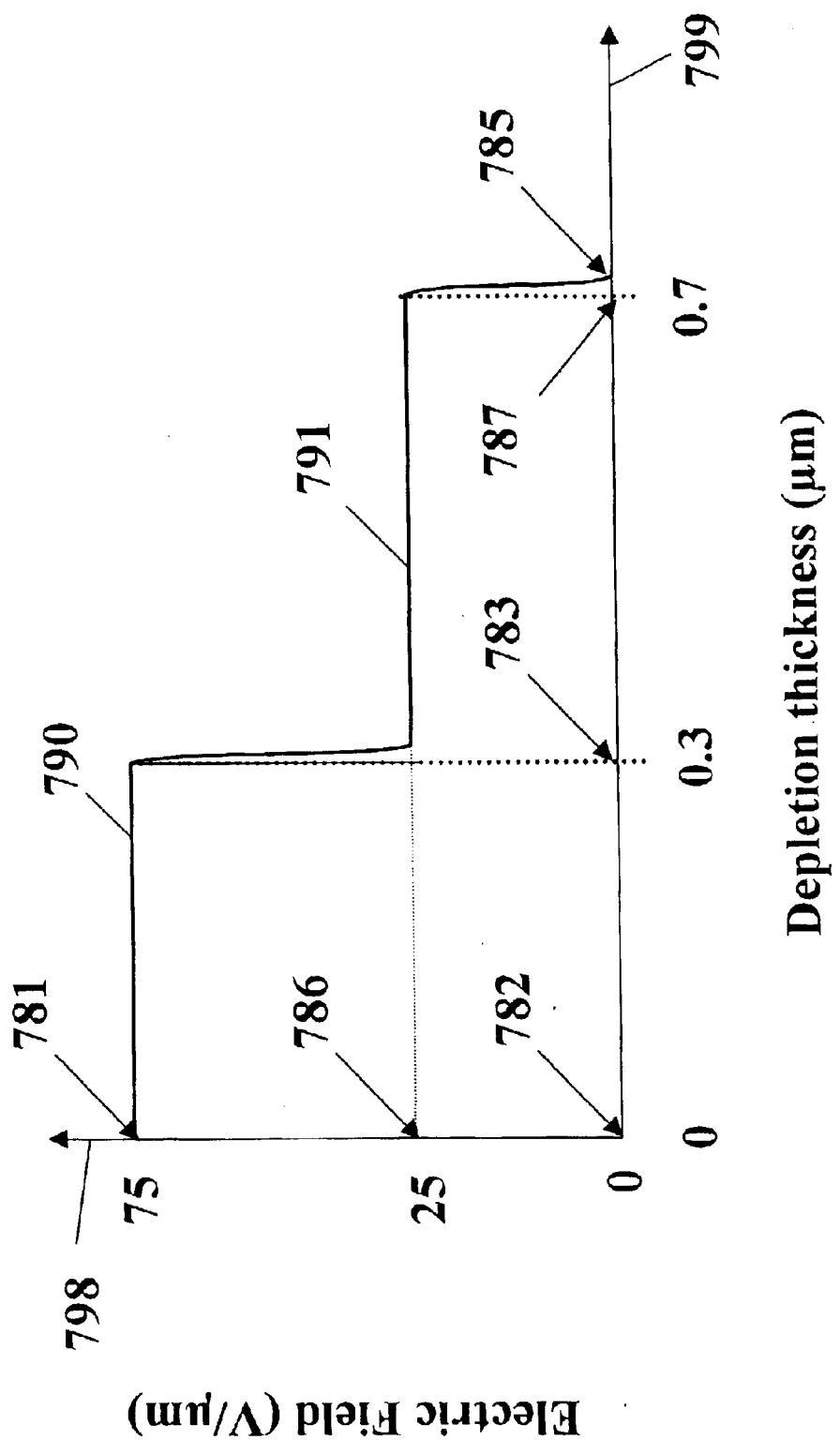
Figure 8: Preferred embodiment electrical field profile

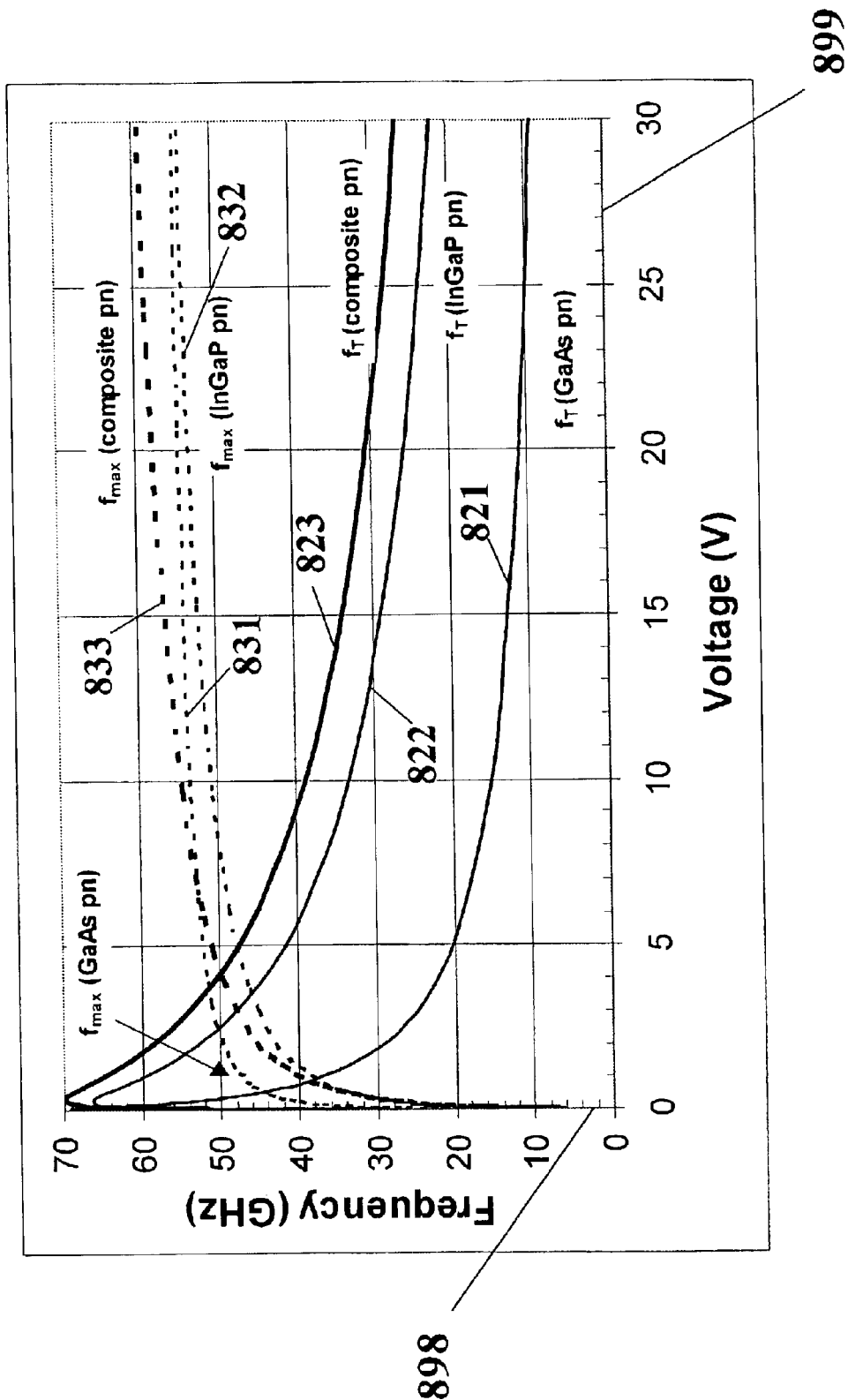
Figure 9: Prior art collector performance

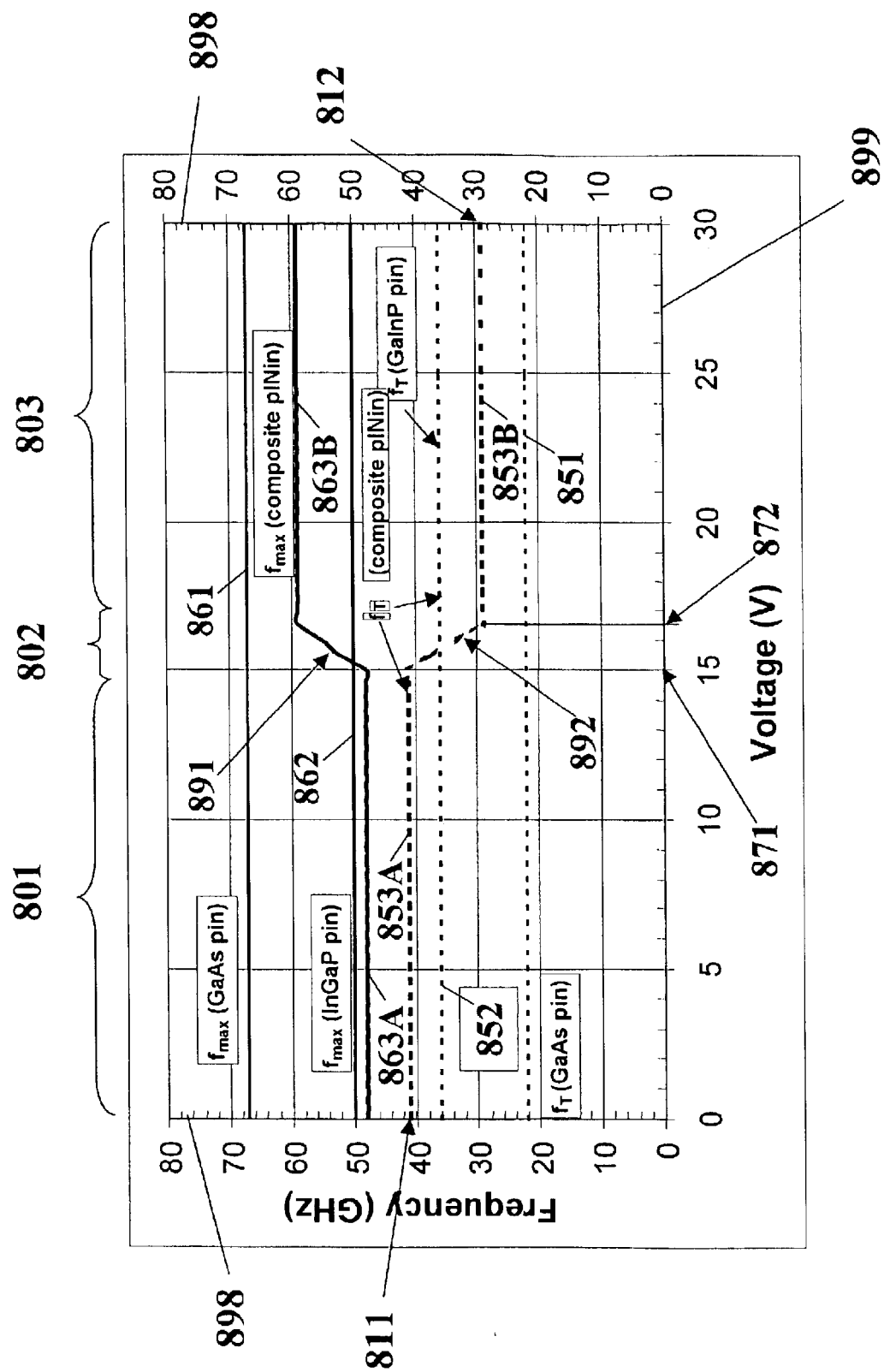
Figure 10: Comparison of preferred embodiment to prior art

COMPOSITE PININ COLLECTOR STRUCTURE FOR HETEROJUNCTION BIPOLAR TRANSISTORS

BACKGROUND OF THE INVENTION

An HBT produces a current output between its emitter and its collector. The output current ($I_C$) is some function of the input current ($I_B$) imposed between its base and its collector. Of particular interest is the case where the output is a good linear approximation of the input, so their ratio is well-described as a current gain factor a/k/a current gain approximated by the form $I_C = \beta\, I_B$. The input function may be time-varying, so a value $f_T$ is ordinarily defined to denote the frequency at which the current gain of the HBT falls to unity. $f_T$ can be estimated from:

$$\frac{1}{2\pi f_T} = \tau_F + \frac{k_B T}{q I_C}(C_E + C_{BC}) + (R_E + R_C)C_{BC} \qquad (1)$$

A related value $f_{max}$ is defined to denote the frequency at which the power gain of the HBT falls to unity, which may be estimated from:

$$f_{max} = \sqrt{\frac{f_T}{8\pi R_B C_{BC}}} \qquad (2)$$

In equations (1) and (2), $C_E$ and $C_{BC}$ refer to the capacitances across the emitter-base and the base-collector junctions, respectively. $R_B$, $R_E$ and $R_C$ refer to the extrinsic base, emitter and collector resistances, respectively. $I_C$ is the total collector current. $k_B$ is Boltzmann's constant. T is the absolute temperature. q is the charge of an electron. $\tau_F$ is the emitter-to-collector transit time, which sums the base transit time ($\tau_B$) and the collector transit time ($\tau_C$), so $\tau_F = \tau_B + \tau_C$.

High output power is commercially valuable. It is often achieved in part by using a high output voltage. A high voltage requires that the transistor's breakdown voltage across the base, between the emitter and the collector, (commonly denoted in the literature as $VB_{ECO}$ or $BV_{ECO}$) be as high, or conservatively twice as high, as the output voltage. The breakdown voltage is determined by the materials properties of the semiconductor used for the collector, and by the other design parameters, such as alloy composition and doping density. An important design goal is therefore to increase $BV_{ECO}$ for a given $f_T$, or equivalently, to increase $f_T$ for a given $BV_{ECO}$.

Exceeding $BV_{ECO}$ can impair system performance. In some cases, the damage is irreversible to the transistor itself or to other elements of the circuit comprising the transistor. Yet requiring that a transistor operate at a voltage with some safety factor far below $BV_{ECO}$, requires a compromise in performance and/or using a more expensive, large, power-hungry transistor.

What is needed is a transistor which allows operation at a first, very high speed $f_T$ up to a first voltage level, followed by operation at a second, lower speed $f_T$ up to a second, higher voltage level. The first voltage level would be the normal operating regime of the transistor, providing a consistently high performance. The second voltage level would provide a safety margin, operating at a reduced performance level in over-voltage conditions.

In the preferred embodiment of the invention disclosed herein, such a transistor is designed with said second voltage level near the nominal breakdown voltage of the device, and said first voltage level at roughly half of said second voltage level.

More generally, the invention specifies a means for improving the performance and breakdown voltage of an HBT, wherein the means entails a novel base-collector structure. The rest of the transistor will preferably be optimized to make good use of the novel collector, though such optimizations are not strictly necessary to enable the invention.

BRIEF DESCRIPTION OF THE FIGURES

FIG. 1 shows a standard design for the epitaxial stack composing an HBT.

FIGS. 2–7 will describe collector layers in structures reminiscent of, or equivalent to, FIG. 1.

FIGS. 2–4 show prior art collector structures where the doping in the base-collector depletion region exceeds the nominal background doping.

FIGS. 5–6 show prior art collector structures where the base-collector depletion region contains an undoped or unintentionally doped region.

FIG. 7 shows the preferred embodiment of the composite collector structure, a punch-through pinin structure.

FIG. 8 shows the electric field profile for the preferred embodiment near the breakdown $BV_{ECO}$ conditions.

FIG. 9 shows the frequency performance as a function of collector-to-emitter bias for the prior art structures illustrated in FIGS. 2–4.

FIG. 10 shows the frequency performance as a function of collector-to-emitter bias for the prior art structures illustrated in FIGS. 5–6, as well as for the preferred embodiment structure depicted in FIG. 7.

DETAILED DESCRIPTION OF THE FIGURES

FIG. 1 shows the general embodiment of an epitaxial stack composing a standard heterojunction bipolar transistor (HBT). The layers can be formed by well-known techniques such as molecular beam epitaxy (MBE) or chemical vapor deposition (CVD). Those skilled in the art will recognize that the thicknesses, composition, and doping of these layers may be varied in accordance with well-known optimizations. Indeed, the preferred and prior art embodiments differ primarily in the details of the base-collector junction, as well as the thicknesses, doping densities, and materials choices of the various regions. This HBT generically includes a heavily doped emitter contacting layer, a region smoothly grading the conduction band between the emitter contact region and the emitter region, a wide band gap emitter region, a heavily doped base region, a region grading between the base region and the collector region, a collector region, and a heavily doped sub-collector region to facilitate contacts to the collector. The inventors anticipate such optimizations and the use of further, emerging ones, and intend that the invention apply to optimizations consistent with it.

The HBT structure indicated by FIG. 1 (not drawn to scale) has the following layers, enumerated top to bottom:

1. Graded emitter contact layer 101 with thickness 121: grade from n$^+$InAs to n$^+$GaAs, 20 nm, $5 \times 10^{18}$ cm$^{-3}$ doping. The grade from InAs to GaAs can be achieved by a pseudomorphic and lattice relaxed growth of InGaAs.
2. Emitter contact layer 103 with thickness 123: n$^+$GaAs, 100 nm, $5 \times 10^{18}$ cm$^{-3}$ doping.

3. Emitter grade layer 105 with thickness 125: graded from n⁺GaAs to n⁺GaInP, 50 nm, 5×10¹⁸ cm⁻³ doping. The grade from GaAs to GaInP can be achieved by several techniques which advantageously try to avoid the conduction band discontinuity, including pseudo-morphic grading of GaInP, or grading from GaAs to $Al_{0.15}Ga_{0.85}As$, then abruptly switching to GaInP.
4. Emitter layer 107 with thickness 127: n-GaInP, 100 nm, 1×10¹⁷ cm⁻¹³ doping.
5. Base layer 109 with thickness 129: p⁺⁺GaAs base, 35 nm, 7.5×10¹⁹ cm⁻³ doping. (See comments below regarding the base.)
6. Base grade layer 111 with thickness 131: p⁺ base graded from 7.5×10¹⁹ cm⁻³ p⁺GaAs to 1×10¹⁶ cm⁻³ p⁺GaInP over 15 nm.
7. Collector layer 113 with thickness 133: (see collector layer discussion below)
8. Sub-collector layer 115 with thickness 135: n⁺GaAs, 5×10¹⁸ cm⁻³, 1.0 μm.
9. Substrate 117: semi-insulating GaAs substrate It is widely recognized that base parameters can be optimized to increase $f_T$ while maintaining $f_{max}$. For instance, it is usually desirable to dope the base 109 p-type as heavily as practical. An important limitation on this is the doping density beyond which recombination of carriers within the base unacceptably reduces the gain of the device. For example, using hyperdoping, it appears reasonable to use a base doping density of at least 7.5×10¹⁹ cm⁻³ for GaAs. Therefore, the thickness 129 of the base 109 is chosen to optimize $f_{max}$ and $f_T$. A thicker base increases $f_{max}$ at the expense of $f_T$. In the examples above, a 35 nm base thickness has been chosen, but the detailed choice depends on a number of technology factors, including back-end lithographic resolution. The performance estimations presented here assume that the emitter stripe width is 2 μm and the base stripe width is 4 μm. Other emitter and base dimensions generally optimize $f_T$ and $f_{max}$ at different base thicknesses.

In the preferred embodiment, a smooth grading of the conduction band at the base-collector junction is crucial to reducing or eliminating the notch normally formed in DHBT (double HBT) structures and is achieved using graded layer 111. The notch is a well-known artifact of the conduction band offset between the wide band gap collector and the narrow band gap base. SHBT (single HBT) structures generally do not need such a grade region, because no such notch would normally exist if the base and collector use the same materials. If the notch is not made negligible, then a significant charge of minority carriers can pile up at the conduction band discontinuity and reduce the switching speed of the device, particularly when switching out of the saturated mode of operation.

It is also generally valuable to control the base-collector depletion region thickness 139, $W_{BC}$, by controlling the doping density in the collector 113 to optimize equations 1 and 2 via the $C_{BC}$ and $\tau_C$ terms.

Three approaches to doping the collector are usually taken, alone or in combination. First, the collector may be uniformly doped, whereby a constant, uniform doping is chosen based on breakdown, operating voltage, series resistance, and other considerations. The thickness (a/k/a width) of the base-collector depletion region, $W_{BC}$, can be estimated from:

$$W_{BC} = \sqrt{\frac{2\varepsilon_s V_{tot}}{qN_D}} \quad (3)$$

Where $\varepsilon_s$, is the semiconductor permittivity, $V_{tot}=V_{bi}+V_{BC}-2kT/q$, $V_{bi}$ is the built in potential of the junction, $V_{BC}$ is the applied base-collector junction bias, $N_D$ is the doping density in the collector, and the other variables are as defined above. The electrical field profile in the collector for uniform doping will peak at the base-collector junction, and then decay linearly to zero at $W_{BC}$. Therefore, the peak electrical field ($E_{peak}$) is:

$$E_{peak}=2V_{tot}/W_{BC} \quad (4)$$

In general, a transistor possesses a maximum value of $E_{peak}$ beyond which avalanche multiplication and transistor feedback cause an unacceptably large increase in the collector current as the applied bias is increased beyond the transistor emitter to collector, open base breakdown voltage ($BV_{ECO}$). Therefore, the emitter-collector breakdown voltage of a transistor with a uniformly doped collector can be approximated by (neglecting the $V_{bi}$ and 2kT/q terms)

$$BV_{ECO}=(E_{max})(W_{BC})/2 \quad (5)$$

Where $E_{max}$ is the $BV_{ECO}$ breakdown limited maximum electric field in the semiconductor material.

A second approach to doping the collector is to use a pin structure where the base is the p-type region, and most of the base-collector depletion region is supported by an intrinsic (or lightly doped) region such that this region is fully depleted for substantially all voltages of operation. In the case of a pin structure, the electrical field is approximately constant throughout the intrinsic region, with a peak electric field of $E_{peak} \cong V_{tot}/W_{BC}$ or in preference to equation (5), $$BV_{ECO} \cong (E_{max})(W_{BC}) \quad (6)$$

A third approach to doping the collector is to use an arbitrary doping gradient throughout the collector region. For example, an exponential doping gradient could be used with a low doping gradient at the base collector junction and a high value at the neutral side of the collector. Alternatively, a pin structure could be combined with a uniform doping gradient to provide both a region of flat (uniform) electric field in the intrinsic region and linearly decaying electrical field in the n-type side of the junction. While arbitrary doping gradients are somewhat more difficult to analyze, the structure can be analyzed using Poisson's equation to determine the breakdown voltage of the structure.

To simplify the discussion, we will focus entirely on changes to the collector layer 113 in FIGS. 2–7. The rest of the HBT embedding the (prior art or novel) collector layer under discussion can be generalized from FIG. 1. Note that not all embodiments of an HBT will use all layers of FIG. 1, and some embodiments of an HBT will include additional layers, but all embodiments of an HBT must include the emitter 107, base 109, and collector 133 layers.

FIGS. 2–6 show several prior art realizations of the collector region. For the example designs shown here, nominal operation occurs at voltages between 0 and 15 V, with breakdown voltage $BV_{ECO}$ chosen to be 30 V to ensure a sufficient margin of safety for normal operation.

FIG. 2 shows a prior art collector approach using a uniformly doped n-GaAs collector (SHBT), with the doping density of 7.5×10¹⁵ cm⁻³ chosen to enable a $BV_{ECO}$ of ~30 V. In the figure, collector layer 213 would be used to replace the collector layer 113 in FIG. 1, and layer 111 would be eliminated because there is no need to grade the base-collector junction of a SHBT. This structure is commonly referred to as a p+n junction, where the p+ side is formed from the base region (layer 109) and the n-side is formed from layer 213 of thickness 233. The graph in the figure shows the electric field magnitude along the y-axis 298 as a function of the depth into the collector along the x-axis 299 near breakdown. The breakdown field 281 limited by $BV_{ECO}$ is the maximum magnitude of the electric field that the device can sustain without exhibiting emitter-to-collector breakdown with the base open circuited, which, for GaAs, is approximately 25 V/μm. The magnitude of the electrical field 290 decays linearly from 281 to a minimum value at 285, because the ionized dopant atoms in the collector region screen the applied voltage. The maximum electrical field 281 generally occurs at the metallurgical junction between the p-type base and the n-type collector at point 282, and the point 285 where the electrical field decays to near its minimum value is the depletion width on the n-type side of the junction. Due to the fact that most HBT designs utilize a p+n junction, depletion into the p-type side of the junction is negligible. To achieve a $BV_{ECO}$ of 30 V requires the total collector thickness at 285 to be ~2.4 μm.

Note that the 25 V/μm $BV_{ECO}$ breakdown field cited is lower than the ~50 V/μm nominal breakdown field of GaAs, because feedback from transistor action requires the $BV_{ECO}$ breakdown field to be considerably lower than the nominal breakdown field, and therefore, we assume that the $BV_{ECO}$ breakdown field in GaAs is approximately ½ the nominal breakdown field of the material. We define the $BV_{ECO}$ breakdown electric field $E_{max}$ to be the electric field at which breakdown occurs between the emitter and collector with the base open circuited (see equation 5).

FIG. 3 shows an alternative prior art collector approach using a uniformly doped N-GaInP collector (DHBT). In the figure, collector layer 313 would be used to replace the collector layer 113 in FIG. 1. Because the $BV_{ECO}$ breakdown field in GaInP is approximately 3 times larger than for GaAs, the collector thickness 333 can be reduced by the same factor, and the doping density would be increased to $7.0 \times 10^{16}$ cm$^{-3}$ to maintain a $BV_{ECO}$ of ~30 V. This structure is commonly referred to as a p+n heterojunction, where the p+ side is formed from the base region (layers 109 and 111) and the N− side is formed from layer 313 of thickness 333. The graph in the figure shows the electric field magnitude along the y-axis 398 as a function of the depth into the collector along the x-axis 399 near breakdown. The $BV_{ECO}$ limited breakdown field 381 is the maximum magnitude of the electric field that the device can sustain without exhibiting emitter-to-collector breakdown with the base open circuited. The magnitude of the electrical field 390 decays linearly from 381 to a minimum value at 385. The maximum electrical field 381 generally occurs at the metallurgical junction between the p-type base and the N-type collector at point 382, and the point 385 where the electrical field decays to near its minimum value is the depletion width on the n-type side of the junction. Due to the fact that most HBT designs utilize a p+N heterojunction, depletion into the p-type side of the junction is negligible. To achieve a $BV_{ECO}$ of 30 V requires the total collector thickness at 385 to be ~0.8 μm.

FIG. 4 shows another alternative prior art approach using a uniformly doped composite n-GaInP/n-GaAs collector, where n-GaInP is used for the region of the base-collector junction closest to the base where the electrical field is greater than the $BV_{ECO}$ breakdown field for GaAs (i.e. about 25 V/μm), and n-GaAs is used for the region where the electrical field has been lowered to below the $BV_{ECO}$ breakdown field of GaAs. The advantage of the composite collector approach is that GaInP is used to hold off the high electrical field; but once the electrical field falls off sufficiently, GaAs can be used for the remainder of the collector since GaAs has a better saturated drift velocity than GaInP. Furthermore, the structure has a lowered collector resistance because GaAs has a higher mobility, so the undepleted portion of the GaAs collector (for example at lower voltages) has a lower resistance than an equivalent GaInP region.

In the FIG. 4, collector layer 413A with thickness 433A and layer 413B with thickness 433B would be used to replace the collector layer 113 in FIG. 1. Because the $BV_{ECO}$ breakdown field in GaInP is approximately 3 times larger than for GaAs, the total collector thickness (433A plus 433B) can be reduced by the same factor, and the doping density would be increased to $7.0 \times 10^{16}$ cm$^{-3}$ to maintain the $BV_{ECO}$ of ~30 V. This structure is commonly referred to as a p+Nn composite structure, where the p+ side is formed from the base region (layers 109 and 111), the N− side is formed in the GaInP layer 413A of thickness 433A, and the n− side is formed in the GaAs layer 413B of thickness 433B. The graph in the figure shows the electric field magnitude along the y-axis 498 as a function of the depth into the collector along the x-axis 499 near breakdown. The GaInP $BV_{ECO}$ limited breakdown field 481 in is the maximum magnitude of the electric field that the device can sustain without exhibiting emitter-to-collector breakdown with the base open circuited. The magnitude of the electrical field 490 decays linearly from point 481 to point 483, the GaAs $BV_{ECO}$ limited breakdown field 486 at a depth 484 at the start of region 413B. The magnitude of the electrical field 490 decays linearly from 483 to a minimum value at 485. The maximum electrical field 481 generally occurs at the metallurgical junction between the p-type base and the N-type collector at point 482, and the point 485 where the electrical field decays to near its minimum value is the depletion width on the n-type side of the junction. Due to the fact that most HBT designs will utilize a p+Nn heterojunction, depletion into the p-type side of the junction is negligible. To achieve a $BV_{ECO}$ of 30 V requires the total collector thickness at 485 to be ~0.8 μm.

FIG. 5 shows another prior art approach using a GaAs pin structure in the collector, where the base of the transistor is the p-type region, and the collector layers form the intrinsic and n-type layers. In FIG. 5, collector layers 513A and 513B would be used to replace the collector layer 113 in FIG. 1. Because this is a SHBT device, the base grade layer 111 should be eliminated because the conduction band offset between the base and the collector will be negligible. By using a pin structure, the electrical field in the collector is kept approximately constant, enabling approximately twice the voltage to be developed for a given collector thickness, or the same voltage to be held off using approximately ½ the collector thickness, or some linear combination of these benefits. Since our illustrative example comparing prior to novel art uses a stated 30 V $BV_{ECO}$ for the optimization, the SHBT pin collector shown in FIG. 5 uses ½ the collector thickness 533A compared to the collector thickness 233 of FIG. 2 to achieve the same value of $BV_{ECO}$. This structure is commonly referred to as a pin junction, where the p$^+$ side is formed from the base region (layers 109) and the i-region is formed from layer 513A with a thickness 533A, and the n-side is formed from layer 513B with a thickness 533B. The graph in the figure shows the electric field magnitude along the y-axis 598 as a function of the depth into the collector along the x-axis 599 near breakdown. The $BV_{ECO}$ limited breakdown field 581 is the maximum magnitude of the electric field that the device can sustain without exhibiting emitter-to-collector breakdown with the base open circuited. The magnitude of the electrical field 590 is approximately constant from the metallurgical junction between the p-type base and the i-type collector at point 582 to the end of the intrinsic region at 585, where the electric field magnitude will then decay abruptly to near it's minimum value. The magnitude of the electrical field 590 is approximately constant from the metallurgical junction between the p-type base and the i-type collector at point 582, and the point 585 where the electrical field decays to near its minimum value. Points 582 and 585 define the depletion width on the collector side of the junction. Due to the fact that this HBT designs utilize a $p^+in^+$ junction, depletion into the p-type side of the junction (into layer 111) and into the n-type side of the junction (into layer 513B) is negligible. To achieve a $BV_{ECO}$ of 30 V requires the total thickness 533A of the intrinsic region 513A to be ~1.2 μm.

FIG. 6 shows another prior art approach using an GaInP pIN structure in the collector, where the base of the transistor is the p-type region, and the collector layers form the intrinsic and n-type layers. In FIG. 6, collector layers 613A and 613B would be used to replace the collector layer 113 in FIG. 1. The use of GaInP enables 3 times higher electrical fields to be supported than in GaAs, and therefore devices whose intrinsic collector regions 613A are ⅓ as thick as that the collector region 513A shown in FIG. 5. This structure is commonly referred to as a pIN heterojunction, where the $p^+$ side is formed from the base region (layers 109 and 111) and the I-region is formed from layer 613A with a thickness 633A, and the N-side is formed from layer 613B with a thickness 633B. The graph in the figure shows the electric field magnitude along the y-axis 698 as a function of the depth into the collector along the x-axis 699 near breakdown. The $BV_{ECO}$ limited breakdown field 681 is the maximum magnitude of the electric field that the device can sustain without exhibiting emitter-to-collector breakdown with the base open circuited. The $BV_{ECO}$ limited breakdown field 681 is the maximum magnitude of the electric field that the device can sustain without exhibiting emitter-to-collector breakdown with the base open circuited. The magnitude of the electrical field 690 is approximately constant from the metallurgical junction between the p-type base and the I-type collector at point 682, to the end of the intrinsic region at 685 where the electrical field decays to near its minimum value. Points 682 and 685 define the depletion width on the collector side of the junction. Due to the fact that this HBT designs utilize a $p^+IN^+$ heterojunction, depletion into the p-type side of the junction (into layer 111) and into the N-type side of the junction (into layer 613B) is negligible. To achieve a $BV_{ECO}$ of 30 V requires the total thickness 633A of the intrinsic region 613A to be ~0.4 μm.

A key advantage of a thinner collector depletion region is a shorter collector transit time, and hence a higher $f_T$. Unfortunately, a thinner collector depletion region also means a higher collector capacitance, so the collector thickness cannot be reduced indefinitely, because $f_{max}$ becomes low enough to make $f_T$ unuseful.

FIG. 7 illustrates the preferred embodiment. The HBT structure indicated by FIG. 7 (not drawn to scale) has the following layers, enumerated top to bottom:

1. Graded emitter contact layer 701 with thickness 721: grade from $n^+InAs$ to $n^+GaAs$, 20 nm, $5 \times 10^{18}$ cm$^{-3}$ doping. The grade from InAs to GaAs can be achieved by a pseudomorphic and lattice relaxed growth using InGaAs.
2. Emitter contact layer 703 with thickness 723: $n^+GaAs$, 100 nm, $5 \times 10^{18}$ cm$^{-3}$ doping.
3. Emitter grade layer 705 with thickness 725: graded from $n^+GaAs$ to $n^+GaInP$, 50 nm, $5 \times 10^{18}$ cm$^{-3}$ doping. The grade from GaAs to GaInP can be achieved by several techniques which advantageously try to avoid the conduction band discontinuity (electron affinity), including pseudomorphic grading of GaInP, or grading from GaAs to $Al_{0.15}Ga_{0.85}As$, then abruptly switching to GaInP.
4. Emitter layer 707 with thickness 727: n-GaInP, 100 nm, $1 \times 10^{17}$ cm$^{-13}$ doping.
5. Base layer 709 with thickness 729: $p^{++}GaAs$ base, 35 nm, $7.5 \times 10^{19}$ cm$^{-3}$ doping. (See comments regarding layer 3.)
6. Base grade layer 711 with thickness 731: $p^+$ base graded from $7.5 \times 10^{19}$ cm$^{-3}$ $p^+GaAs$ to $1 \times 10^{18}$ cm$^{-3}$ $p^+GaInP$ over 15 nm.
7. Collector layer 713A with thickness 733A: intrinsic or not intentionally doped GaInP with a thickness of 3000 nm. To maximize the potential dropped across this layer, it is desirable to have a background doping density with a net ionized charge density less than $1 \times 10^{15}$ cm$^{-3}$.
8. Collector layer 713B with thickness 733B: n-type GaInP, 325 nm doped to $1 \times 10^{18}$ cm$^{-3}$.
9. Collector layer 713C with thickness 733C: intrinsic GaAs, 4000 nm, undoped or not intentionally doped.
10. Collector layer 713D with thickness 733D: n-type GaAs, 1000 nm, doped to $2 \times 10^{18}$ cm$^{-3}$.
11. Sub-collector layer 715 with thickness 735: $n^{+GaAs}$, $5 \times 10^{18}$ cm$^{-3}$, 1.0 μm.
12. Substrate 717: semi-insulating GaAs substrate The preferred embodiment will be seen to have several important features:

1. The graded emitter contact layer 701 InAs emitter contact layer provides low resistance, non-alloyed ohmic contacts to an n-type, wider band gap emitter.
2. The smooth grade of the conduction band between the InAs emitter contact layer and the GaInP emitter (combination of layers 701, 703, and 705) reduces series resistance and capacitance, giving improved performance. Many approximations to actual smoothness are well-known and are acceptable, such as many small, stepwise changes.
3. The abrupt emitter-base junction (between layers 707 and 709) injects electrons with about 0.12 eV of kinetic energy, enabling faster base transport than would a lower conduction band offset at the emitter-base junction. The small conduction band offset enables the abrupt junction to be used without degradation in performance from increased emitter series resistance. Note that prior art AlGaAs/GaAs HBTs usually use a In graded junction to increase performance. The abrupt junction also eases fabrication and increases reliability.
4. The very thin, heavily doped base 709 increases $f_T$ without ruining $f_{max}$. Hyperdoping enables this to be achieved with high device reliability.
5. Smooth grading of the conduction band between the base and the wider band gap collector in layer 711 eliminates the charge pile up at the base-collector junction from a conduction band step discontinuity that an abrupt DHBT junction would exhibit.
6. A composite pINin DHBT collector structure, where the p-type region is the base of the HBT (combination of layers 709 and 711), the first intrinsic region 733A is GaInP, the first n-type region 733B is GaInP, the second intrinsic region 733C is GaAs, and the second n-type region 733D is GaAs. Layer 713B is designed to prevent penetration of the electrical field deeper into the collector (i.e. layers 713C and 713D) for voltages less than 15 V. For voltages less than 15 V, the HBT operates as if it has a single pIN base-collector junction with a relatively thin intrinsic layer, and is therefore fast. Layer 713C is used to support the additional electrical field that occurs for voltages between 15 V and 30 V, enabling the entire structure to withstand 30 V of applied bias that would not be possible with the 3000 nm GaInP layer alone. For alternative embodiments, it may be desirable to lightly doped layer 713C n-type to reduce resistivity through this layer. Layer 713D is used to terminate the base-collector depletion region at a depth of approximately 7325 nm (sum of the layer thickness 733A, 773B, and 773C). This structure enables increased performance to 15 V while retaining $BV_{ECO}$ at 30 V.

7. A heavily doped n+GaAs sub-collector 715 to provide low resistance conduction between the collector and the collector contact.

A factor of 2 safety margin between the nominal breakdown voltage and the claimed $BV_{ECO}$ can be included (as we have done here) or omitted in the description without loss of generality. This may be needed when comparing the HBT design disclosed here with competing designs using incompatible terminology.

FIG. 7 shows the preferred embodiment incorporating the composite GaInP/GaAs pINin structure. We describe it for operation up to 15 V normally, with extended operation up to 30 V; other voltage ranges are possible by obvious extrapolation. As in the case of prior art FIG. 4, the composite GaInP/GaAs structure enables the collector to be optimized for various regimes of operation, such as high $f_T$ operation up to a first voltage, along with lower $f_T$ operation up to a second, higher voltage. In order to ensure that the high electrical field in the GaInP layer 713A does not penetrate into the GaAs layer 713C, a thin, heavily doped n-type GaInP layer 713B is preferably built between the intrinsic GaInP layer 713A and the intrinsic GaAs layer 713C. This thin n-GaInP 713B layer can be chosen to support about 16 V operation before being completely depleted, enabling operation at up to about 15 V to be supported solely by the I-GaInP layer 713A. For higher voltages than 16 V, the thin, heavily doped region fully depletes, and the depletion region then extends ("punches through") to the end of the intrinsic GaAs region 713C. The device is most accurately described as a "punch through pINin" device, where the first pIN portion supports 15 V at full performance, while the second Nin region supports a $BV_{ECO}$ of 30 V with somewhat degraded performance as indicated by a second, lower value for $f_T$.

In FIG. 8 is the electric field profile as a function of position at an emitter to collector bias near $BV_{ECO}$. The x-axis 799 shows the depletion layer thickness in microns, and y-axis 798 shows the electric field magnitude in V/µm. Due to the difference in breakdown field between GaInP and GaAs, the electrical field 790 in the GaInP, is approximately 3 times larger than the electrical field 791 in the GaAs. The electrical field in the GaInP 713A is used to support the nominal operating voltage of 0–15 V, and for voltages above 15 V, the electrical field extends into the intrinsic GaAs region 713C to support a higher breakdown voltage than would be possible using the thin GaInP layer 713A alone.

The magnitude of the electrical field is approximately constant at a value 781 between the start of the collector at 782 to the end of the I-GaInP layer at 783. The electric field then decays rapidly through region 713B to a value of 768. The electrical field profile then remains constant at a magnitude 768 through to the end of the I-GaAs region at 787, where it subsequently decays to near zero at 785.

Those skilled in the art will recognize that this technique can be used for any suitable collector material, such as the p-GaAs/i-GaInP/n-GaInP/i-GaAs/n-GaAs shown in the preferred embodiment of FIG. 7, as well as p-GaAs/i-GaAs/n-GaAs/i-GaAs/n-GaAs, p-GaAs/i-GaInP/n-GaInP/i-GaInP/ n-GaInP, p-GaAs/i-AlGaAs/n-AlGaAs/i-GaAs/n-GaAs, p-GaAs/i-AlGaInP/n-AlGaInP/i-GaAs/n-GaAs. The concept may be readily extended to other materials and other materials systems, such as p-InGaAs/i-InP/n-InP/i-InGaAs/ n-InGaAs or p-InGaAs/i-AlInAs/n-AlInAs/i-InGaAs/n-InGaAs for transistors based on InP. Furthermore, the technique can be used for pnp transistor structures as well, using a nipip structure as opposed to the preferred embodiment using the pinin structure.

FIG. 9 shows the estimated performance of the prior art approaches shown in FIGS. 2–4. In the figure, the x-axis 899 is the emitter-to-collector voltage, and the y-axis 898 is the frequency in GHz. Curves 821 and 831 show the estimated $f_T$ and $f_{max}$ response, respectively, for the prior art SHBT embodiment of FIG. 2. Curves 822 and 832 show the estimated $f_T$ and $f_{max}$ response, respectively, for the prior art DHBT embodiment of FIG. 3. Curves 823 and 833 show the estimated $f_T$ and $f_{max}$ response, respectively, for the prior art composite collector embodiment of FIG. 4. As shown in FIG. 9, the best performance is achieved by the composite collector (curves 823 and 833), followed by slightly degraded $f_T$ performance 822 the DHBT, and the lowest $f_T$ performance 821 for the SHBT. The SHBT actually exhibits a higher $f_{max}$ performance 831 compared to the DHBT $f_{max}$ performance 832 because the collector capacitance is reduced by a factor of three compared to the DHBT structure of FIG. 3.

FIG. 10 shows the estimated performance of the preferred embodiment from FIG. 7 compared against the prior art approaches of FIGS. 5 and 6. In the figure, the x-axis 899 is the emitter-to-collector voltage, and the y-axis 898 is the frequency in GHz. Region 801 shows the region up to the first operating voltage (~16 V) where higher performance is achieved for the preferred embodiment. Region 802 shows the discontinuity in performance as the middle n-region of the pINin structure is punched through, and region 803 shows the reduce performance that is maintained for the preferred embodiment up to the nominal $BV_{ECO}$ of 30 V. Curves 851 and 861 show the estimated $f_T$ and $f_{max}$ response, respectively, for the prior art pin SHBT embodiment of FIG. 5. Curves 852 and 862 show the estimated $f_T$ and $f_{max}$ response, respectively, for the prior art pIN DHBT embodiment of FIG. 6. Curves 853A and 863A show the estimated $f_T$ and $f_{max}$ response, respectively for voltage biases in region 801, for the preferred embodiment pINin collector structure shown in FIG. 7. Curves 853B and 863B show the estimated $f_T$ and $f_{max}$ response, respectively for voltage biases in region 803, for the preferred embodiment pINin collector structure shown in FIG. 7. As shown in FIG. 9, the best $f_T$ performance in region 801 is achieved by the preferred embodiment pINin collector (curve 863A), followed by slightly degraded $f_T$ performance for the DHBT (curve 852), and the lowest $f_T$ performance for the SHBT (curve 851). For the same bias range, the SHBT actually exhibits the highest $f_{max}$ performance 861 because the collector capacitance is reduced by a factor of three compared to the DHBT structure of FIG. 3. Furthermore, the DHBT structure exhibits a slightly higher $f_{max}$ performance 862 compared to the preferred embodiment $f_{max}$ performance 863A due to it's approximately 25% lower capacitance for emitter-to-collector biases between 0–15 V. Beyond 16 V, the N-GaInP layer 713C is "punched-through," extending the collector depletion region to 785 and resulting in a stepwise decrease in $f_T$ 892 and a corresponding stepwise increase in $f_{max}$ 891 (due to the reduction in the base-collector capacitance). The $f_T$ for this example of the preferred embodiment in region 801 is 811 (about 40 GHz). The $f_T$ for region 803 is slightly degraded to 812 (about 30 GHz). Although a pn devices (see FIG. 9) exhibit a strong voltage dependency for their frequency response, pin or pINin (see FIG. 10) devices exhibit a frequency response approximately independent of the voltage applied to the base-collector junction, apart from one or more abrupt discontinuities for the pINin device. The actual frequency response is generally expected to exhibit a slight slope from high frequency to a lower frequency as the voltage bias is increased, due to the decrease in saturation drift velocity at higher electric fields. Maintaining a constant frequency response as a function of operating voltage is advantageous for large signal devices where normal operation requires high-speed modulation of the output voltage over the entire range of operating conditions.

An exemplary implementation of the preferred embodiment has two regimes of operation, as shown in FIG. 10:

a. Between 0–15 V (region 801), the transistor achieves 40 GHz $f_T$ and almost 50 GHz $f_{max}$.

b. Between 16–30 V (region 803), the device performance is slightly degraded, with 30 GHz $f_T$ and a 60 GHz $f_{max}$.

In ordinary operation, the transistor would operate entirely below the discontinuity voltage near region 802. Where overvoltage conditions occur above the discontinuity voltage but below $BV_{ECO}$, (region 803) the transistor would continue to operate with a performance that is high yet below the $f_T$ available in the lower regime. This combination advantageously offers protection against reaching breakdown conditions while maintaining high performance, and without making the performance compromises necessitated in prior art designs.

It is clear how to extend this concept to three or more voltage levels and $f_T$ values, e.g., as a pininin structure. This concept is useful even when regions 713A is lightly doped such that it only become depleted after application of a small fraction (i.e. 20%) of the maximum bias available in region 801. Likewise the invention remains useful even when region 713C is lightly doped such that it only becomes completely depleted after application of a small fraction (i.e. the first 20%) of the bias available in region 803. Furthermore, the invention may also be optimized to eliminate layer 713C and use a relatively low doping in layer 713D (i.e. at least an order of magnitude lower than the doping in layer 713B), resulting in a linear decay in the electrical field with depth into layer 713D only after layer 713B has been completely depleted ("punched through") at the lowest bias available in region 803. One key feature of the invention is the ability to maintain a high level of performance using a pin collector structure up to a specified voltage level 871, and then have the $f_T$ peformance degrade after punch through of the n-type region occurs at voltage level 872. For voltages higher than 872 the HBT operates in another regime of operation that enables a high $BV_{ECO}$ performance to be achieved at the cost of degraded $f_T$ peformance.

We claim:

1. A bipolar transistor comprising an n-type emitter, a p-type base region, and a collector region comprising a first intrinsic region, an n-type region, a second intrinsic region, and a second n-type region, in sequence.

2. The transistor in accordance with claim 1 wherein the first or second intrinsic region is omitted.

3. The transistor in accordance with claim 2 having a first $f_T$ that exhibits a maximum near zeo bias and decays gradually for signal voltage up to a first maximum voltage, and an approximately constant second $f_T$ for a signal voltage between said first maximum voltage and a second maximum voltage, such that said first voltage is lower than said second voltage, and the $f_T$ for biases smaller in magnitude than the first voltage is higher than the second $f_T$.

4. The transistor in accordance with claim 3 wherein said second $f_T$ varies by less than 20% for a signal voltage between the range of 120% of the first maximum voltage and 90% of said second maximum voltage.

5. The transistor in accordance with claim 3 wherein said second voltage is near the $VB_{ECO}$ of said transistor.

6. The transistor in accordance with claim 1 wherein the second n-type region is followed by a third intrinsic region and a third n-type region.

7. The transistor in accordance with claim 1 having a first $f_T$ for a signal voltage up to a first maximum voltage, and a second $f_T$ for a signal voltage between said first maximum voltage and a second maximum voltage, wherein said first voltage is lower than said second voltage, and said first $f_T$ is higher than said second $f_T$.

8. The transistor in accordance with claim 7 wherein said first $f_T$ varies by less than 10% for a signal voltage over the range of 20–90% of said first maximum voltage.

9. The transistor in accordance with claim 7 wherein said second voltage is near the $VB_{ECO}$ of said transistor.

10. A bipolar transistor comprising a p-type emitter, an n-type base region, and a collector comprising a first intrinsic region, a p-type region, a second intrinsic region, and a second p-type region, in sequence.

11. The transistor in accordance with claim 10 wherein the first or second intrinsic region is omitted.

12. The transistor in accordance with claim 11 having a first $f_T$ for a signal voltage up to a first maximum voltage, and a decaying second $f_T$ for a signal voltage between said first maximum voltage and a second maximum voltage, such that said first voltage is lower than said second voltage, and said first $f_T$ is higher than the $f_T$ for biases larger in magnitude than the first voltage.

13. The transistor in accordance with claim 12 wherein said first $f_T$ varies by less than 20% for a signal voltage over the range of 20–90% of said first maximum voltage.

14. The transistor in accordance with claim 12 wherein said second voltage is near the $VB_{ECO}$ of said transistor.

15. The transistor in accordance with claim 10 wherein the second p-type region is followed by a third intrinsic region and a third p-type region.

16. The transistor in accordance with claim 10 having a first $f_T$ for a signal voltage up to a first maximum voltage, and a second $f_T$ for a signal voltage between said first maximum voltage and a second maximum voltage, wherein said first voltage is lower than said second voltage, and said first $f_T$ is higher than said second $f_T$.

17. The transistor in accordance with claim 16 wherein said first $f_T$ varies by less than 10% for a signal voltage over the range of 20–90% of said first maximum voltage.

18. The transistor in accordance with claim 16 wherein said second voltage is near the $VB_{ECO}$ of said transistor.

* * * * *